United States Patent
Nishioka et al.

[11] Patent Number: 6,063,514
[45] Date of Patent: May 16, 2000

[54] GAS-TIGHT ARTICLE AND A PRODUCING PROCESS THEREOF

[75] Inventors: Masao Nishioka, Tokoname; Yasufumi Aihara, Nagoya; Keiichiro Watanabe, Kasugai, all of Japan

[73] Assignee: NGK Insulators, Ltd., Japan

[21] Appl. No.: 09/047,525

[22] Filed: Mar. 25, 1998

[30] Foreign Application Priority Data

Apr. 9, 1997 [JP] Japan ................................. 9-105400

[51] Int. Cl.[7] ............................ B32B 19/00; B21F 29/00; C04B 38/06
[52] U.S. Cl. .................... 428/698; 428/545; 428/539.5; 428/312.6; 501/88
[58] Field of Search ................... 428/545, 312.6, 428/312.8, 457, 469, 689, 698, 539.5; 264/682; 427/589; 501/88

[56] References Cited

U.S. PATENT DOCUMENTS

| | | | |
|---|---|---|---|
| 3,951,587 | 4/1976 | Alliegro et al. | 432/253 |
| 4,795,673 | 1/1989 | Frechette et al. | 428/331 |
| 5,229,193 | 7/1993 | Madono et al. | 428/212 |
| 5,589,116 | 12/1996 | Kojima et al. | 264/65 |
| 5,628,938 | 5/1997 | Sangeeta et al. | 264/28 |
| 5,683,824 | 11/1997 | Kobayashi et al. | 428/698 |
| 5,882,807 | 3/1999 | Funato et al. | 428/698 |

FOREIGN PATENT DOCUMENTS 0 427 294 A1  5/1991  European Pat. Off. .
WO 96/26910   9/1996  WIPO .

OTHER PUBLICATIONS

"Preparation and Mechanical Properties of CVD–SiC"; Proc. of International Symposium on Ceramic Components for Engine, 1983, Japan; K. Niihara, A. Suda and T. Hirai (The Research Institute for Iron, Steel, and Other Metals, Tohoku University, Sendai 980, Japan).

Primary Examiner—Deborah Jones
Assistant Examiner—Stephen Stein
Attorney, Agent, or Firm—Parkhurst & Wendel, L.L.P.

[57] ABSTRACT

A gas-tight article includes a sintered body composed mainly of a silicon carbide, and a film of silicon carbide formed on a surface of the sintered body by chemical vapor deposition and covering said surface of the sintered body, wherein cracks are formed in the film of the silicon carbide, and the cracks are filled with metallic silicon.

5 Claims, 17 Drawing Sheets

FIG_1a
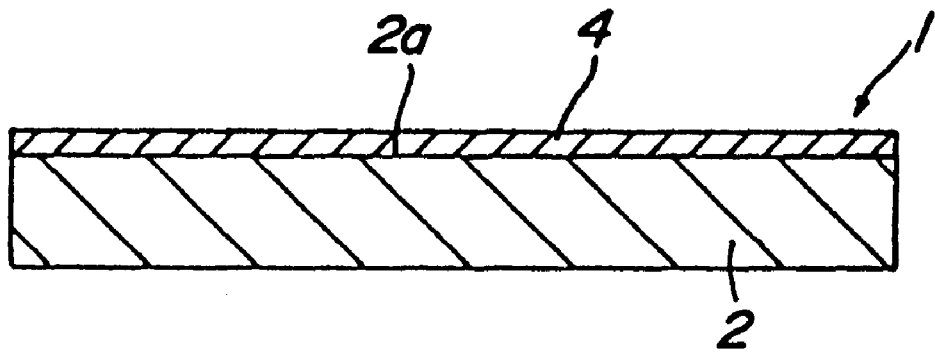
FIG_1b
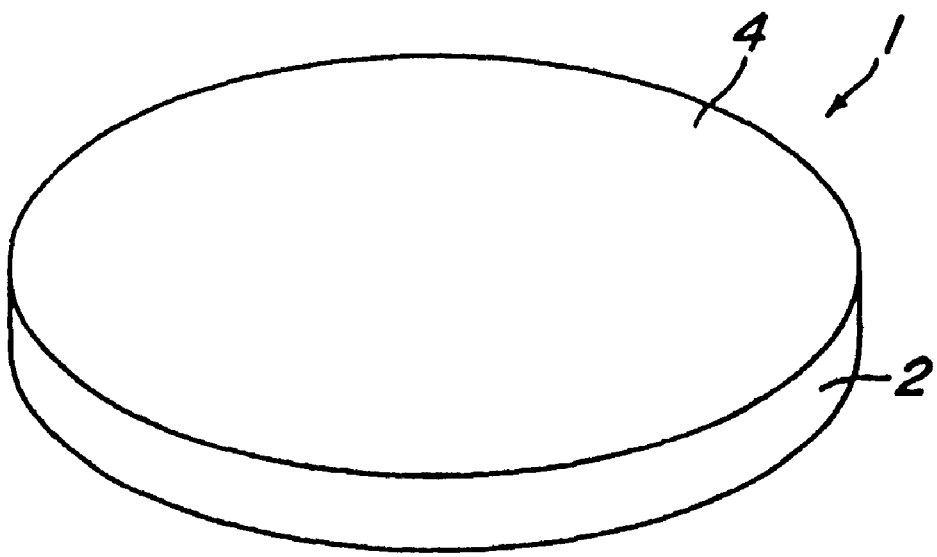

FIG_4
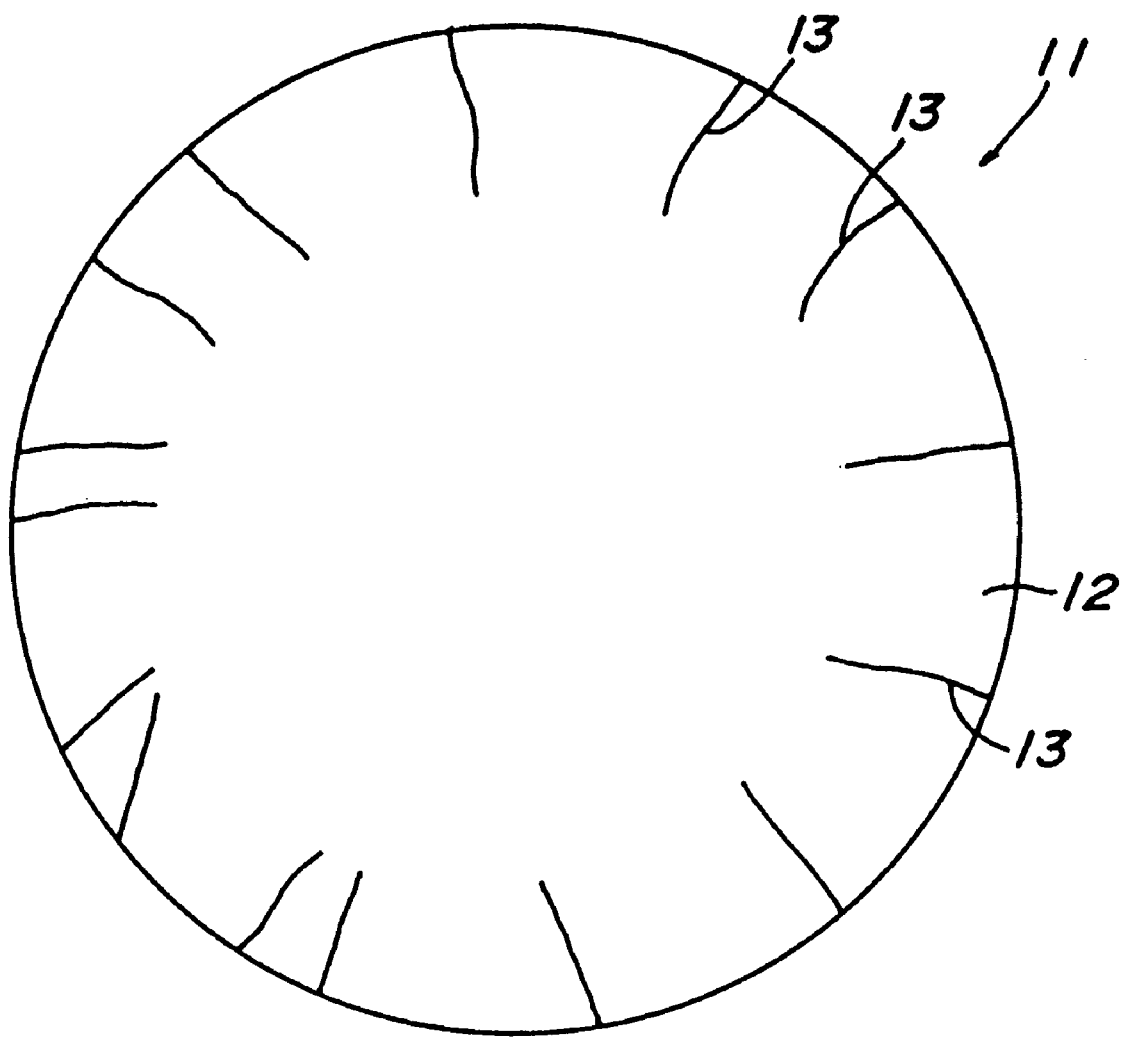

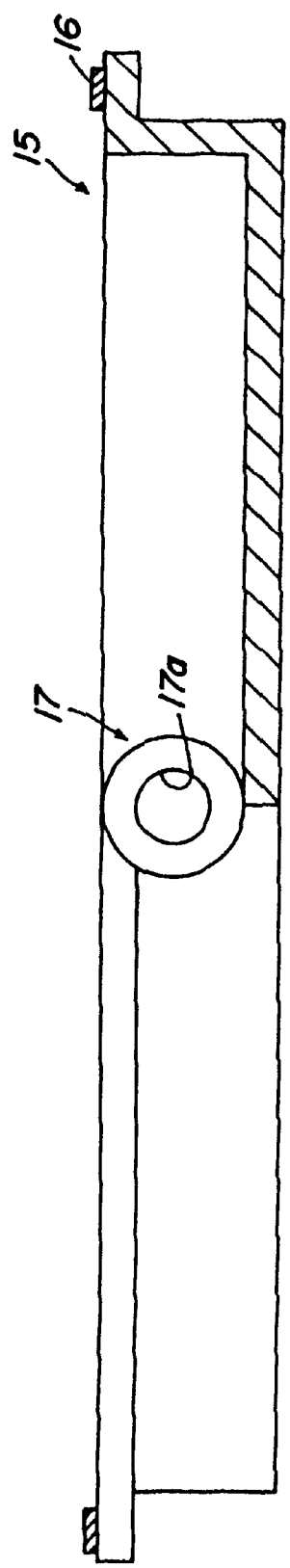
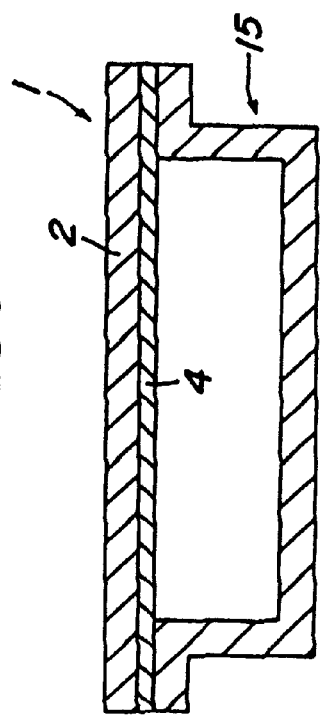
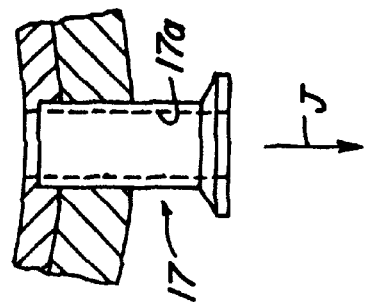

FIG_11

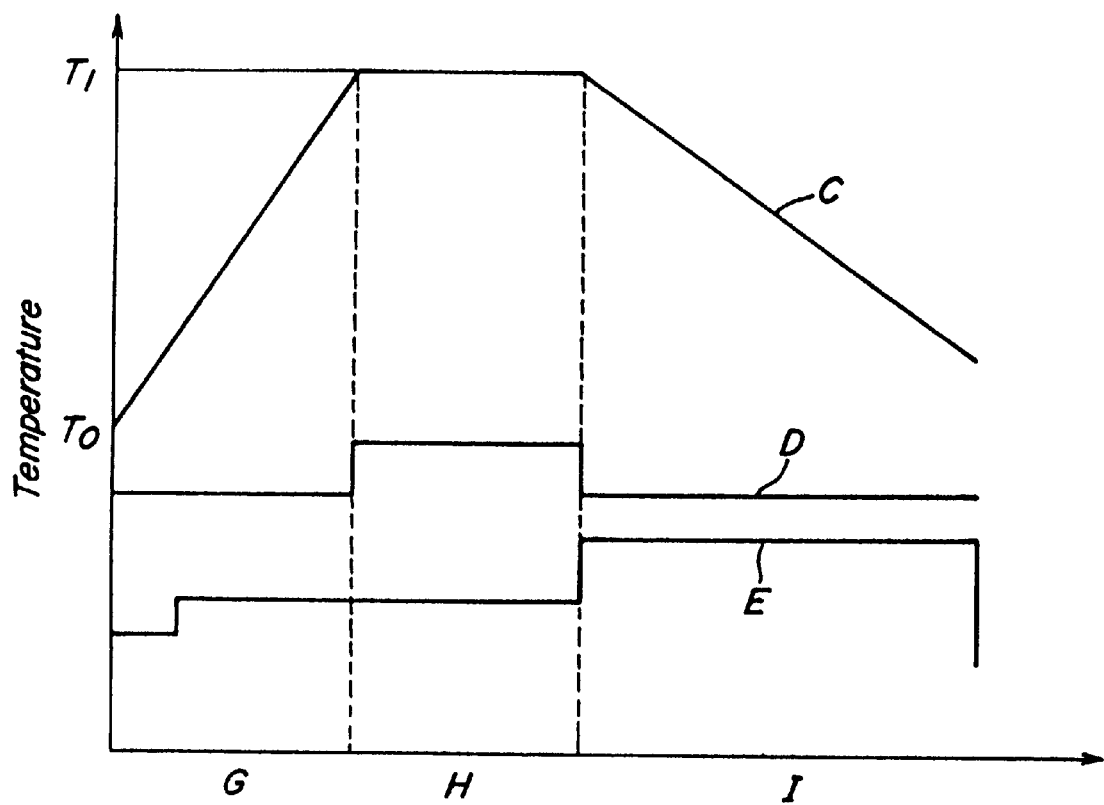
FIG_13

FIG_14a
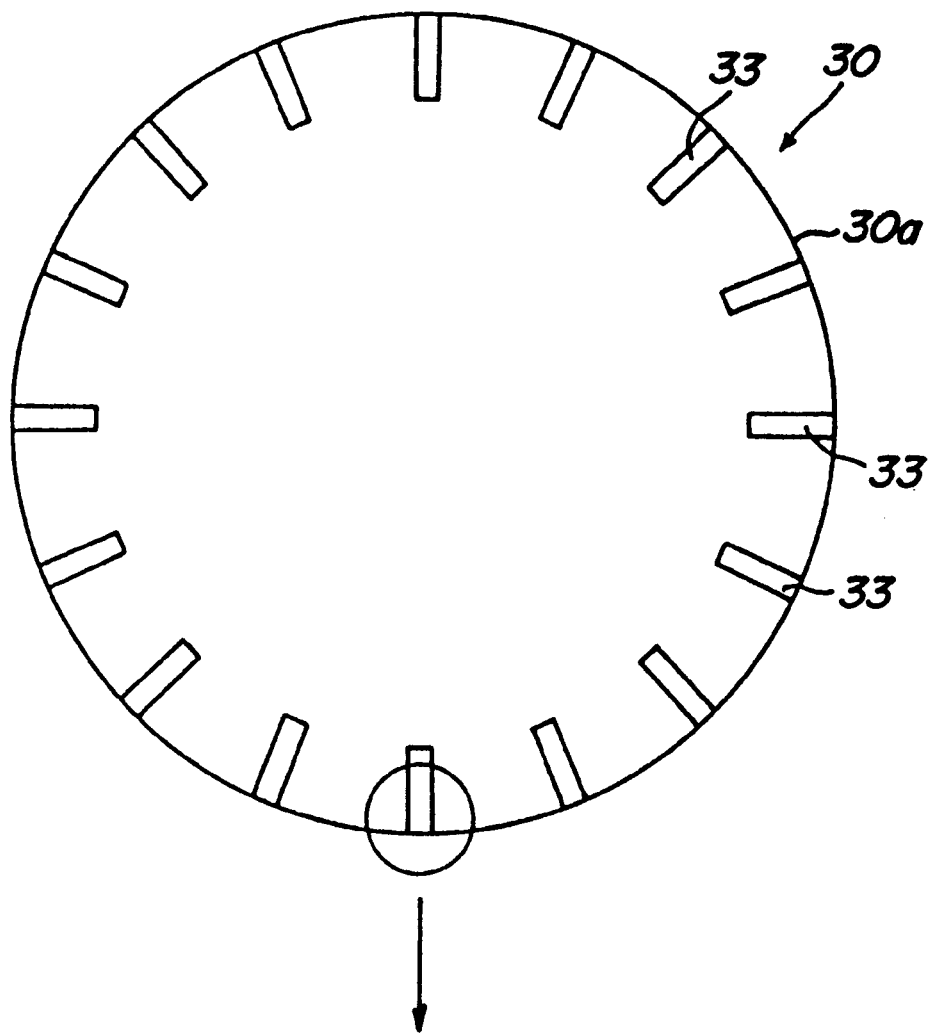
FIG_14b
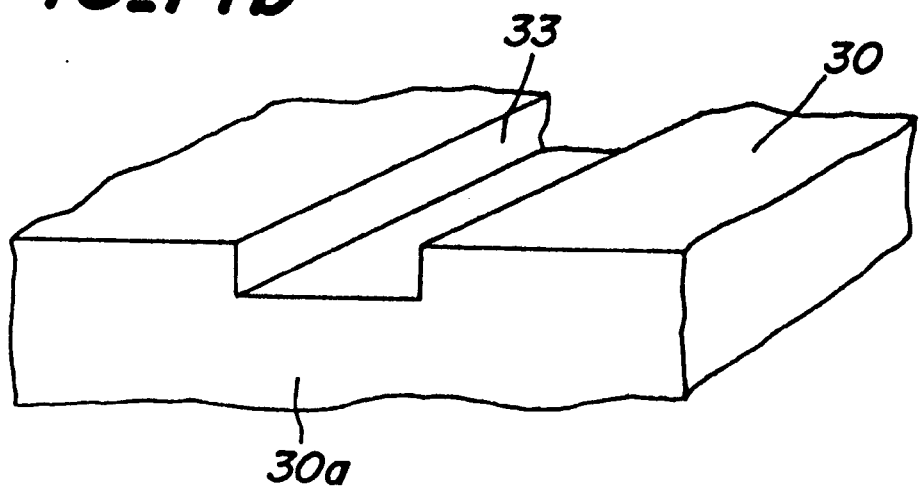

FIG_15a
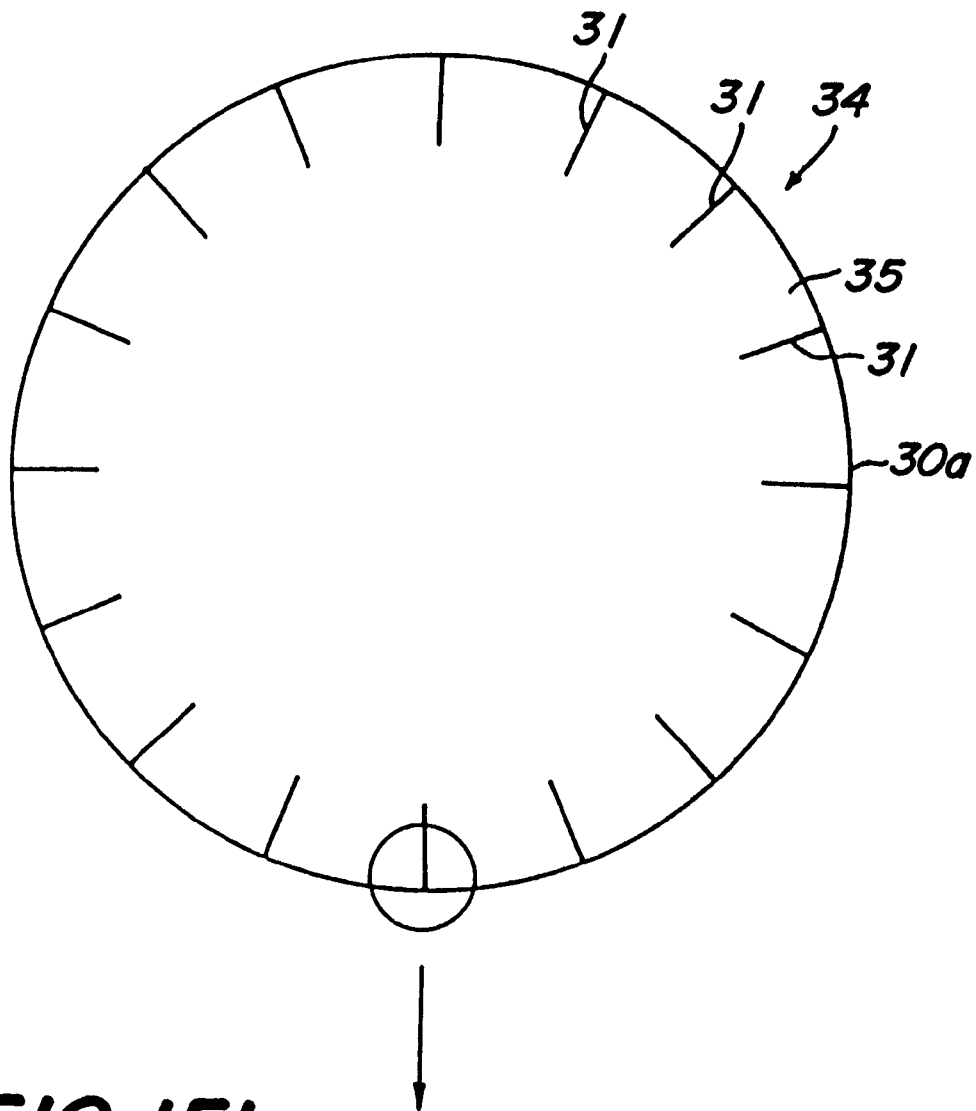
FIG_15b
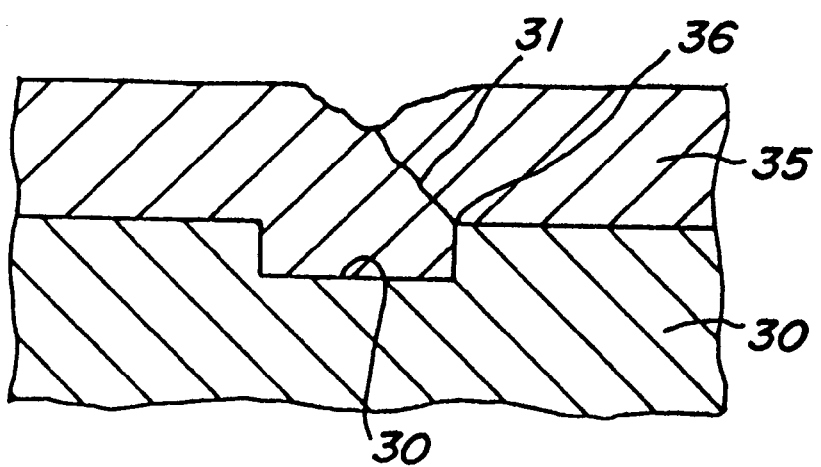

FIG_17a
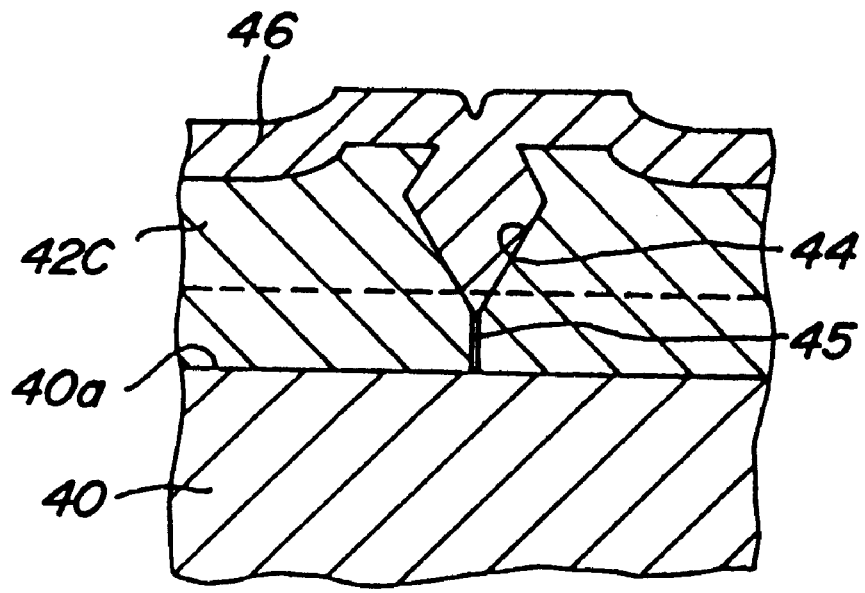
FIG_17b
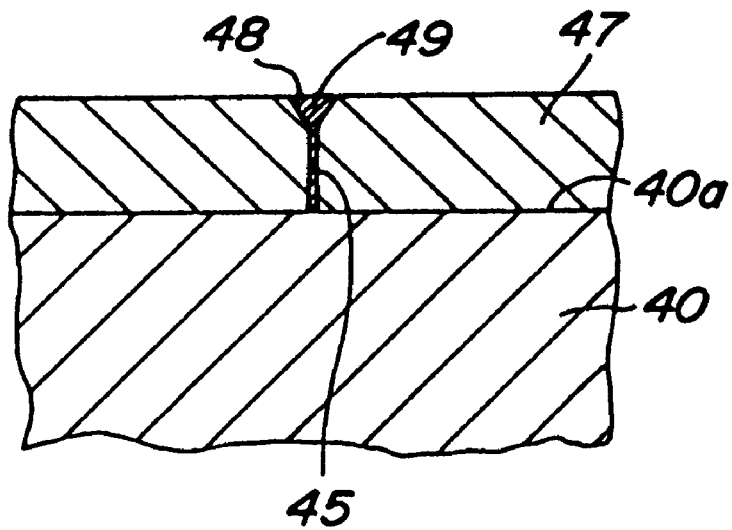

6,063,514

GAS-TIGHT ARTICLE AND A PRODUCING PROCESS THEREOF

BACKGROUND OF THE INVENTION (1) Field of the Invention

The present invention relates to a gas-tight article and a process for producing the same.

(2) Related Art Statement

It is known that a film of dense silicon carbide is effective as an oxidation resistive film to be formed on surfaces of ceramic members for use in high temperature atmosphere, such as liners for gas turbine parts and diesel engine parts. Further, it is known that surfaces of ceramic members are covered with thin films of dense silicon carbide in some uses such as a semiconductor-producing apparatus. In order to form such thin films, a chemical gas phase growing process, an electrochemical gas phase growing process, a sputtering process, a flame spraying process, etc. are known. For example, since a dense thin film having high purity and good quality can be formed by the gas phase process, this process is often used.

Gas-tight articles, which are to be exposed to a reactive plasma gas, are demanded, for example, in the production of semiconductors. As such a reactive plasma gas, $CF_4$, $NF_3$, $ClF_3$, HF, HCl, HBr, etc. may be recited, which are all highly corrosive. Gas-tight articles, which can maintain gas-tightness over a prolonged period of time under an environment where they are exposed to such a highly corrosive gas, have been demanded.

The present inventors made investigations to cope with the demand, and encountered problems. That is, in order to enable gas-tight articles to be used in, for example, a semiconductor producing apparatus over a prolonged time period, the thickness of the film of silicon carbide must be increased. Recently, the area of the semiconductor wafer is increasing. Accordingly, in order to treat such a large size of the semiconductor wafer with for example low-pressure plasma, the large-area surface of the sintered body must be covered with a film of gas-tight silicon carbide.

However, since such a gas-tight article is to be actually subjected to heat impact between room temperature and high temperatures, the film of silicon carbide in the gas-tight article is likely to be cracked due to heat impact. If cracks are formed like this, the gas-tightness of the silicon carbide film is degraded to disable it to be used.

SUMMARY OF THE INVENTION

It is an object of the present invention to provide a gas-tight article including a sintered body composed mainly of silicon carbide and a film of silicon carbide formed on the surface of the sintered body by chemical vapor deposition and covering this surface of the sintered body, which gas-tight article has high gas-tightness and high corrosion resistance and can maintain gas-tightness even under application of heat impact and heat cycles.

The present invention relates to a gas-tight article comprising a sintered body composed mainly of silicon carbide, and a film of silicon carbide formed on a surface of the sintered body by chemical vapor deposition and covering said surface of the sintered body, wherein cracks are formed in the film of the silicon carbide, and the cracks are filled with metallic silicon.

The present invention also relates to a process for producing a gas-tight article, comprising the steps of preparing a sintered body composed mainly of silicon carbide, forming a film of silicon carbide on a surface of the sintered body by chemical vapor deposition such that the film of the silicon carbide covers the surface of the sintered body, forming cracks in the film of the silicon carbide, bringing metallic silicon into contact with the film of the silicon carbide, filling the cracks with the metallic silicon by heating the metallic silicon at not less than a melting point of the metallic silicon.

These and other objects, features and advantages of the present invention will be appreciated upon reading the following description of the invention when taken in conjunction with the attached drawings, with the understanding that some modifications, variations and changes of the same could be easily made by the skilled person in the art to which the invention pertains.

BRIEF DESCRIPTION OF THE DRAWINGS

For a better understanding of the invention, reference is made to the attached drawings, wherein:

FIG. 1(a) is a sectional view of an embodiment of the gas-tight article 1, and FIG. 1(b) is a perspective view of the gas-tight article in FIG. 1(a);

FIG. 4 is a plane view for illustrating the state in which cracks 13 are formed in a film 12 of silicon carbide on a gas-tight article 11;

FIGS. 5(a) to 5(c) are reference views for illustrating methods of the measurement of gas-tightness of the film of silicon carbide on the gas-tight article 1, respectively;

FIG. 13 is a graph showing a temperature schedule to be adopted as another preferred embodiment of the present invention;

FIG. 14(a) is a plane view showing a sintered body 30 to be used in a still another embodiment of the present invention, and FIG. 14(b) is a partially enlarged perspective view of FIG. 14(a);

FIG. 15(a) is a plane view showing a gas-tight article 34 in which a film of silicon carbide is formed on the sintered body in FIG. 14, and metallic silicon is charged to cracks in the gas-tight article, and FIG. 15(b) is a partially enlarged sectional view of FIG. 15(a);

FIGS. 17(a) and 17(b) are sectional view for illustrating for filling the opening 44 and the crack 45 in FIGS. 16(c) with metallic silicon.

The present inventors formed films on silicon carbide sintered bodies having various shapes by the chemical vapor deposition, and examined their gas-tightness and durability against heat impact. As a result, the inventors reached the following knowledge.

For example, the present inventors produced a gas-tight article as shown in FIGS. 1(a) and 2(b). A sintered body 2 has a disc-shaped form, and a film 4 of silicon carbide is formed on the surface 2a of the sintered body 2.

Figure 2:
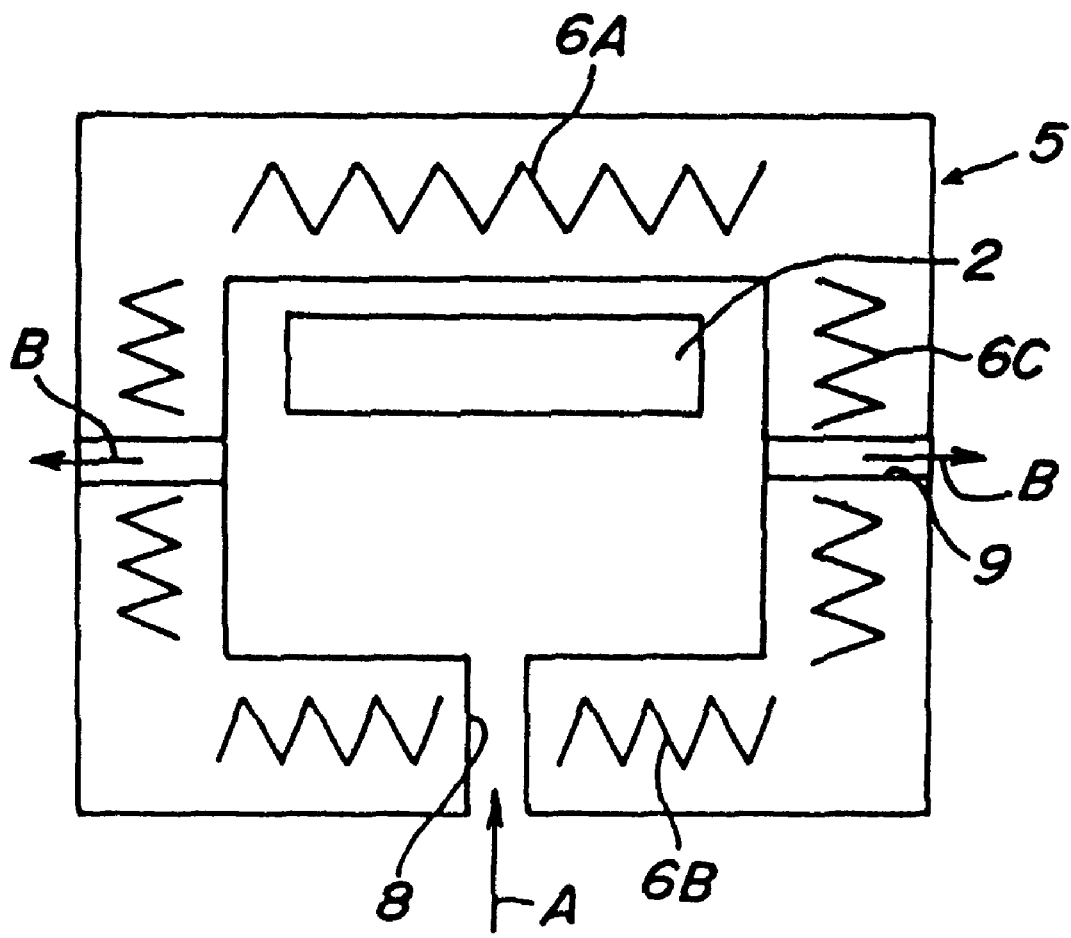
FIG. 2 is a perspective view for schematically illustrating an example of the chemical vapor deposition apparatus to produce the gas-tight article 1.

In order to form a film of silicon carbide on the surface of the sintered body by chemical vapor deposition, a chemical vapor deposition apparatus 5 as shown schematically in FIG. 2 is used. In the apparatus 5, given heaters 6A, 6B and 6C are accommodated in a material constituting a furnace. The sintered body 2 is fixed in the interior space of the furnace, and a reactive gas and a carrier gas are fed through a feed opening as shown by an arrow A, whereas the used reaction gas is discharged through an exhaust opening 9 as shown by an arrow B.

Figure 3:
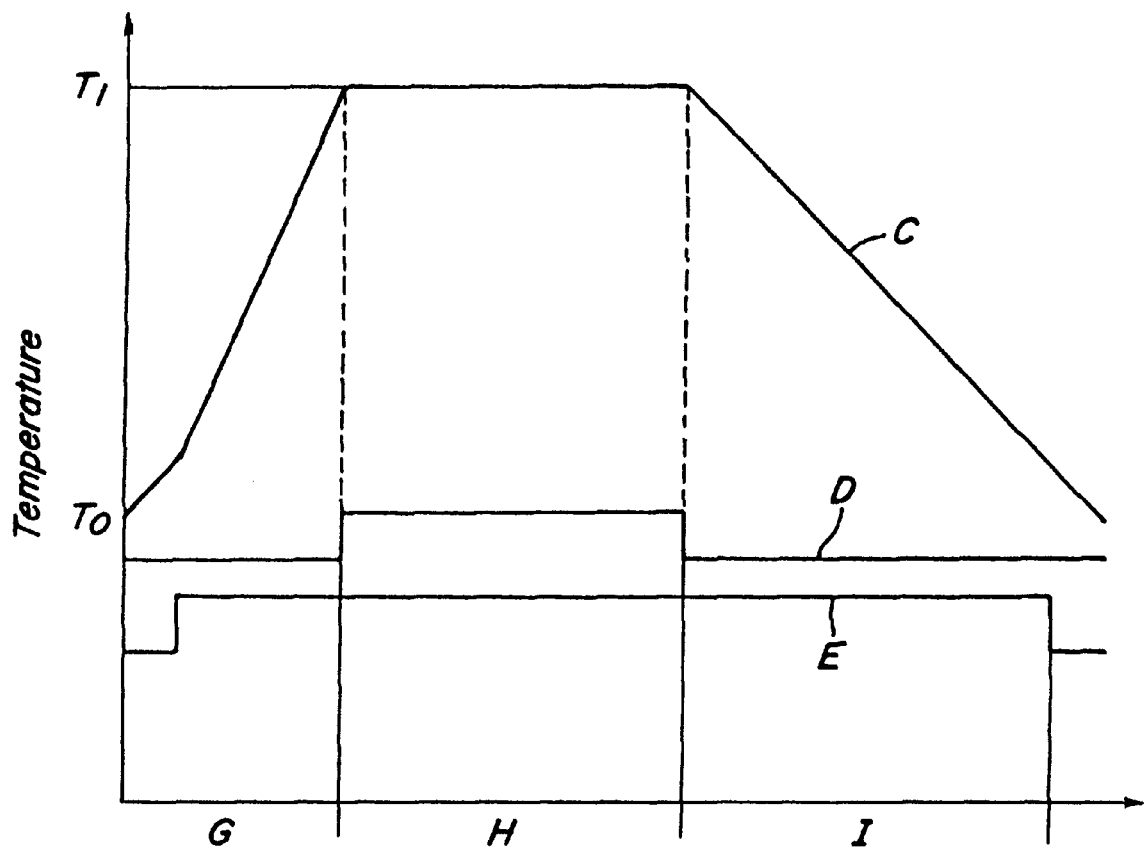
FIG. 3 is a graph for showing a temperature schedule and a gas feed schedule in forming a film of silicon carbide on a sintered body.

As the reactive gas, for example, silicon tetrachloride and methane may be used. FIG. 3 schematically shows atypical schedule in which a line C represents a temperature line, and a line D does a reactive gas feed state, whereas a line E represents a carrier gas feed state.

The temperature is raised from a starting temperature, for example, room temperature, to a maximum temperature $T_1$ at which the chemical vapor deposition is effected (Heating step G). During the heating step, the carrier gas is fed. Then, the temperature is kept at the maximum temperature $T_1$, thereby heating the sintered body 2. The chemical vapor deposition is effected, while the carrier gas and the reactive gas are being fed (Chemical vapor deposition step H). At that time, a reaction: $SiCl_4+CH_4 \rightarrow SiC+4HCl$ occurs. Thus, silicon carbide is formed, and heaped on the surface of the sintered body 2. The reactive gas is contacted with the surface of the sintered body, and discharged outside the furnace as shown by the arrow B (Cooling step I). Thereafter, the sintered body and a film of silicon carbide are cooled (Cooling step I).

The reason why the film of silicon carbide is cracked by subjecting the gas-tight article 1 to heat impact and the heat cycle is considered to be that tensile stress acts in the film of silicon carbide owing to difference in expansion and shrinkage amounts between the film of silicon carbide and the sintered body. In addition to the difference in coefficient of thermal expansion between the sintered body and the film of silicon carbide, the film of silicon carbide is more rapidly cooled than the sintered body, for example, during cooling, and tensile stress inevitably occurs in the film of silicon carbide at low temperatures. It is considered that in the conventional gas-tight article, tensile stress acting in the film of silicon carbide owing to these inevitable causes remains in the gas-tight article, and consequently the film of silicon carbide is cracked by the action of this residual stress and the action of the tensile stress newly applied to the film of silicon carbide.

For this reason, the inventors formed cracks in a film of silicon carbide during the production of the silicon carbide film by the chemical vapor deposition, and then tried to fill the crack with metallic silicon.

More specifically, metallic silicon was placed on or around the crack of the film of silicon carbide, and was melted by heating it at not less than the melting point of the metallic silicon. As a result, it was surprisingly discovered that the melt of the metallic silicon was sucked into the crack to completely fill the crack with the melt. Thereafter, the silicon carbide film was cut in a crack-extending direction, and a cut face thereof was observed, which revealed that up to an end of the crack was completely filled with the metallic silicon. The present inventors reached the present invention based on the above discovery.

In the gas-tight article produced by this process, the crack is already formed in the film of silicon carbide during the formation of the film, and residual stress is conspicuously mitigated. Since the coefficient of thermal expansion of metallic silicon is slightly smaller than that of silicon carbide, it is considered that compression stress can be developed upon silicon carbide after filling the crack with metallic silicon, so that tensile stress which would act upon the film of silicon carbide through exposure of the gas-tight article to heat impact and heat cycles can be offset. As a result, the gas-tightness of the film of silicon carbide can be maintained for a long time period even under the condition at which severe heat impact and heat cycles having not been considered are applied.

In the fine structure of the gas-tight article according to the present invention, since chemical affinity between the vapor-deposited film of silicon carbide and the metallic silicon is high and wettability is good between them, metallic silicon is fully charged into and closely adhered to the fine crack in the film of silicon carbide. As a result, extremely high gas-tightness can be realized. In addition, it is possible that any residual stress can be released by preliminarily forming the cracks in the film of silicon carbide.

According to the gas-tight article and its producing process of the present invention, durability against heat impact and heat cycles of the gas-tight article can be not only enhanced, but also the article can withstand rapid heating and cooling, which could never been realized in the prior art technique.

Accordingly, since the gas-tight article according to the present invention withstands rapid heating and cooling, a speed in treating semiconductor wafers can be conspicuously increased when the gas-tight article is used in the semi-conductor-producing apparatuses. Consequently, the power for the production of the semiconductors per unit time period can be largely enhanced.

By employing the present invention, large gas-tight articles, which could not be formerly produced due to cracks, can be produced. For instance, it has been extremely difficult to produce such gas-tight articles in which a sintered body has a disc-shaped form with a width dimension of not less than 300 mm, and not less than 80% of a main plane of the sintered body is covered with a film of silicon carbide, because a number of cracks are likely to be formed in the film of silicon carbide during cooling this film. However, according to the present invention, such large-dimension gas-tight articles can be produced.

If such a large-dimension gas-tight article is applied to a semiconductor producing apparatus, a large semiconductor wafer can be treated.

If the thickness of the film of silicon carbide is 0.5 mm or more, cracks are likely to be formed in the film of silicon carbide during cooling this film, so that gas tightness of the film of silicon carbide is spoiled. However, such a problem can be solved by the present invention.

Application of the gas-tight articles according to the present invention is not limited to cases where the gas-tight articles are arranged inside the semiconductor producing apparatuses, but the gas-tight articles can be applied to gas-tight products required to have corrosion resistance and disliking contamination. As such applications, parts for chemical analyzers, high purity-corrosion chemical treating apparatuses, radioactive material-handling apparatuses, etc. may be recited.

If the gas-tight article according to the present invention is applied to a semiconductor-related apparatus, the purity of the film of silicon carbide is preferably not less than 99.999 wt %, and that of metallic silicon is preferably more preferably not less than 99.999 wt %.

As parts to be arranged in the semiconductor producing apparatus, an electromagnetic wave-permeable window, a radio frequency electrode device, a radio frequency plasma generation tube, a radio frequency plasma generation dome, an electrostatic ceramic chuck, a ceramic heater, a dummy wafer, a shadow ring, a semiconductor wafer-supporting lift pin, a shower plate, etc. may be recited.

The gas-tight article 1 shown schematically in FIG. 1 is used as a cover for a location inside the semi-conductor-producing apparatus which location is to be brought into contact with reactive plasma. Generally, the inner surface of the film 4 of silicon carbide is exposed to plasma gas, whereas the outer peripheral edge side thereof is designed as a sealing face to keep the gas-tightness. Since the plasma is strongly corrosive, the anti-corrosive, high purity silicon carbide film 4 formed by the chemical vapor deposition is used.

According to the present invention, promoting the formation of the cracks in the silicon carbide film can further enhance durability of the silicon carbide film. For this purpose, the temperature of the silicon carbide is set higher than that of the sintered body during the formation of the silicon carbide film on the sintered body by the chemical vapor deposition. As a result, since the silicon carbide film is more largely shrunk than the sintered body during cooling, large tensile stress acts upon the silicon carbide film, thereby promoting the formation of the cracks.

Further, the formation of the cracks in the silicon carbide film can be promoted by setting the temperature of the silicon carbide film lower than that of the sintered body during cooling in the chemical vapor deposition.

As a specific measure for this, cooling the silicon carbide film can be promoted by flowing excess cooling gas on a side of the silicon carbide film during cooling in the chemical vapor deposition. Alternatively, cooling the silicon carbide film can be promoted by arranging heaters at sides of the silicon carbide film and the sintered body, respectively, inside the chemical vapor deposition apparatus, and setting the temperature of the heater at the side of the silicon carbide film lower than that of the heater at the sintered body.

Alternatively, it may be that grooves are formed at that surface of the sintered body at which a film of silicon carbide is to be formed, a film of silicon carbide is form on this surface, and then cracks is formed in the silicon carbide film along the grooves.

Furthermore, it may be that a shaping member is arranged at a side of that surface of the sintered body at which a film of silicon carbide is to be formed, a film of silicon carbide is formed on this surface by chemical vapor deposition, then the shaping member is removed to form an opening in the silicon carbide, and a crack is formed, extending from the opening toward the sintered body.

As a result, the location in the silicon carbide film where the crack is formed can be specified and controlled. If the gas-tight article according to the present invention is exposed to a corrosive material such as plasma gas, the metallic silicon charged into the crack is more susceptible to corrosion than the silicon carbide film around it. In order to prevent cracks from being formed at a portion of the film to be brought into contact with corrosive material, according to the present invention, such cracks are selectively formed at a portion of the film to be subjected to no exposure with the corrosive material, for example, a portion of the film to constitute a sealing face.

The following may be recited as sintered bodies composed mainly of silicon carbide:
(1) A sintered body having a compounding percentage of silicon carbide being not less than 90% and a relative density of not less than 90%,
(2) A porous sintered body having a compounding percentage of silicon carbide being not less than 90% and a relative density of 56%–90%,
(3) A sintered body of a mixture of silicon carbide and metallic silicon.

COMPARATIVE EXAMPLES AND EXAMPLES

In the following, more specific experimental results will be explained.

Comparative Examples

A gas-tight article was produced according to the process explained with reference to FIGS. 1 to 3. A disc-shaped sintered body composed of silicon carbide and having purity of not less than 99% and relative density of 98% with a diameter of 50 mm and a thickness of 15 mm was used, and a film 4 of silicon carbide was formed on a surface of the sintered body in a thickness of 0.5 mm by chemical vapor deposition. In this case, no crack was formed in the silicon carbide film.

Gas-tight articles were produced according to the process explained with reference to FIGS. 1 to 3. In each of them, a sintered body composed of silicon carbide and having purity of not less than 99% and relative density of 98% was used. The sintered body 2 had a diameter of 280 mm and a thickness of about 15 mm was used, and a film 4 of silicon carbide was formed on a surface 2a of the sintered body 2 in a thickness of 0.5 mm by chemical vapor deposition. In this case, the $T_1$ in FIG. 3 was set at 1400° C. The purity of the silicon carbide film 4 was not less than 99.999 wt %.

As a result, 40% of the thus obtained gas-tight articles exhibited the state as shown in FIG. 4. In the gas-tight article 11, cracks 13 were formed in the film 12 of silicon carbide, extending in radial directions of the disc-shaped sintered body.

Further, one of the gas-tight articles in which no cracks were formed in the silicon carbide film was subjected to the following heat impact test (heat impact test at 180° C.). That is, the gas-tight member was placed and heated to 180° C. in an electric furnace, and the gas-tight article was immersed and left for 20 minutes in water at room temperature. This heat impact test revealed that cracks 13 were formed in the silicon carbide film within the number of times of heat impacts of 20.

Next, the surface of the gas-tight article at which the cracks 13 were formed was polished by using a #400 diamond grinding stone, and a leak amount of helium gas was measured by using a measuring instrument as shown in FIGS. 5(a) to 5(c). As a result, a leaking rate was around $10^{-4}$ Torr·liter/sec. For example, since a gas-tight article to be arranged in a semiconductor producing apparatus is required to have a leaking rate of around $10^{-9}$ Torr·liter/sec., the gas-tight article obtained in the case cannot be applied for this use.

FIG. 5(a) shows the helium leaking amount measuring instrument 15, a left half portion and a right half portion being a front and sectional views thereof, respectively. A gas-tight holding member 16 made of silicone rubber as a flat ring is arranged at an edge of the measuring instrument 15. A vacuum flange 17 is attached to a side of the measuring instrument 15.

As shown in FIG. 5(c), the helium gas leaking rate is measured in the state the gas-tight article is placed on the gas-tight holding member 16 on the measuring instrument 15, and helium gas inside the measuring instrument is sucked through a suction opening 17a of the vacuum flange 17 as shown by an arrow J. The gas is sucked by a helium leakage detector not shown, which is to detect the amount of helium in the gas sucked. Although not shown, the gas-tight article and the measuring instrument 15 are placed in helium gas at 1 atom. If the gas leaks through the gas-tight article, helium enters the measuring instrument, and is detected by the helium leakage detector.

In the above, cracks were formed in the silicon carbide film in each of the gas-tight articles in which the thickness of the silicon carbide film was set at 4 mm. The number of the cracks varied depending upon individual gas-tight articles. When those gas-tight articles were subjected to the above heat impact test, the number of the cracks increased. Some of the gas-tight articles were broken.

Invention Example 1

As in Comparative Examples, gas-tight articles 1 were produced, provided that the thickness of a film of silicon carbide was set at 4 mm.

Figure 6A:
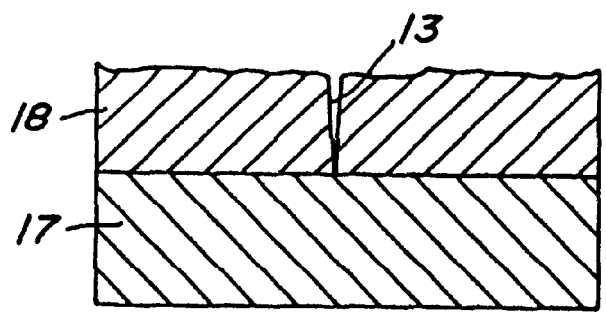
FIG. 6(a) is a sectional view for schematically illustrating the state in which a crack 13 is formed in a film 18 of silicon carbide.
Figure 6B:
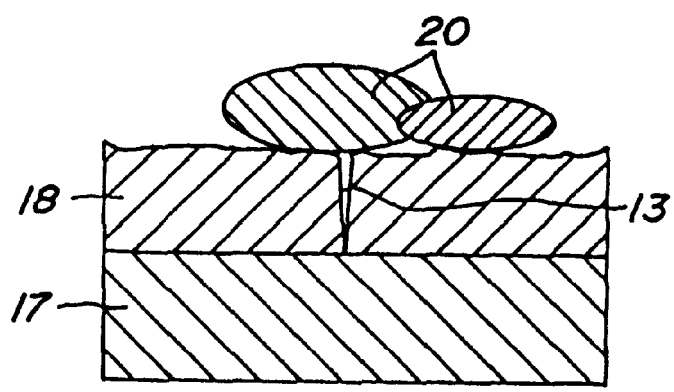
FIG. 6(b) is a sectional view for schematically illustrating a state in which metallic silicon 20 is provided on the film 18 of silicon carbide.

The following process will be explained with reference to schematic sectional views of FIGS. 6(a) through 6(d). A film 18 of silicon carbide is formed on a surface of a sintered body 17, and cracks 13 having shapes as shown in FIG. 4 are formed in the silicon carbide film 18. As shown in FIG. 6(b), metallic silicon 20 having purity of 99.999 wt % is placed above the crack 13. Next, the gas-tight article was heated at 1500° C. in reduced pressure atmosphere, and then cooled. In the heating treatment, the heating temperature is preferably not less than 1420° C. to less than 1800° C.

Figure 7:
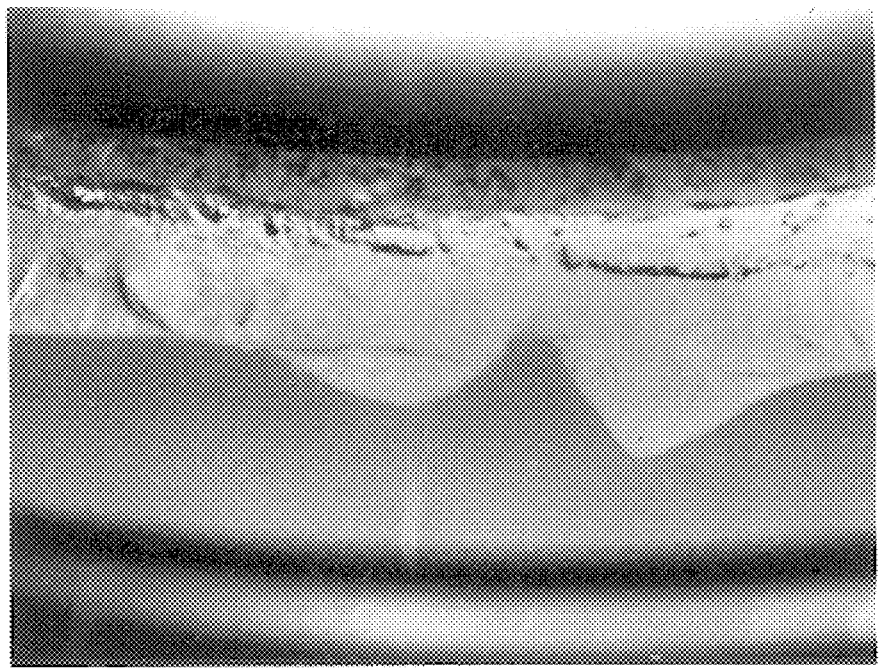
FIG. 7 is a photograph showing a ceramic micro-structure in the state in which the metallic silicon is filled in the crack in the film of silicon carbide.
Figure 8A:
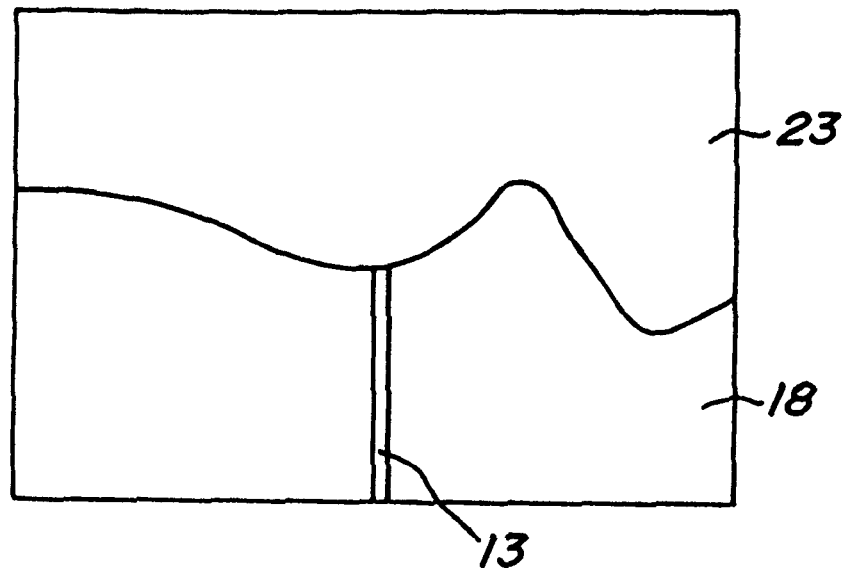
FIGS. 8(a) and 8(b) are views for illustrating a state in which metallic silicon is filled in the crack in a film of silicon carbide.
Figure 8B:
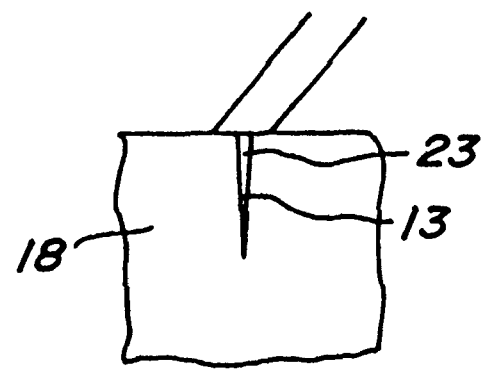

FIG. 7 is a photograph of the surface of the silicon carbide film into which metallic silicon is filled. As shown in this photograph and FIG. 8(a), the metallic silicon is melted, and a silver whitish line of the melted metallic silicon extends along the crack 13 in the silicon carbide film 18. As is schematically shown in FIG. 8(b), the metallic silicon 23 is sucked and filled in the crack 13 over its entire length.

Figure 9:
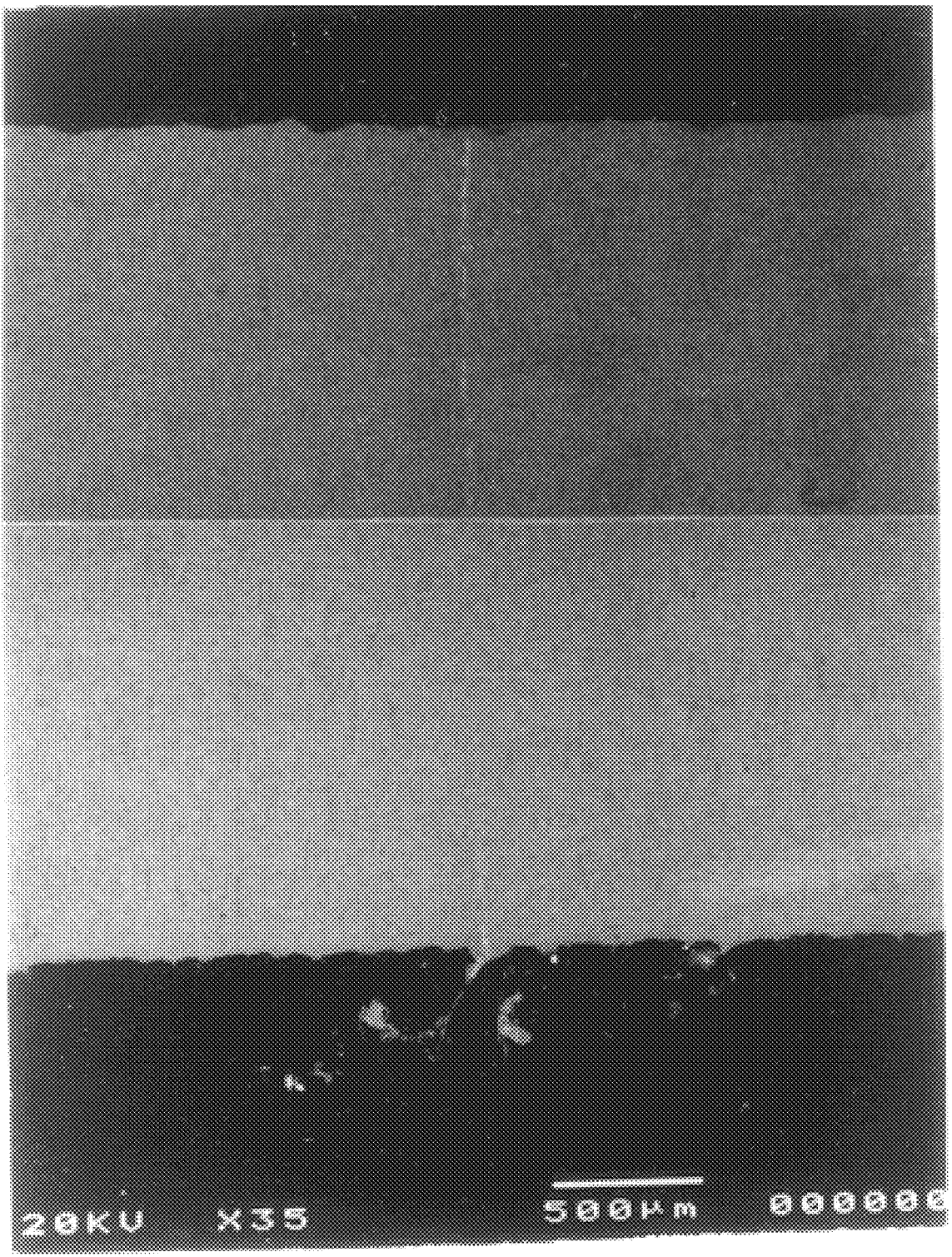
FIG. 9 is a photograph showing a ceramic micro-structure as viewed a film of silicon carbide is cut in a crossing direction as well as a state in which cracks of the film of silicon carbide is filled with metallic silicon.
Figure 10:
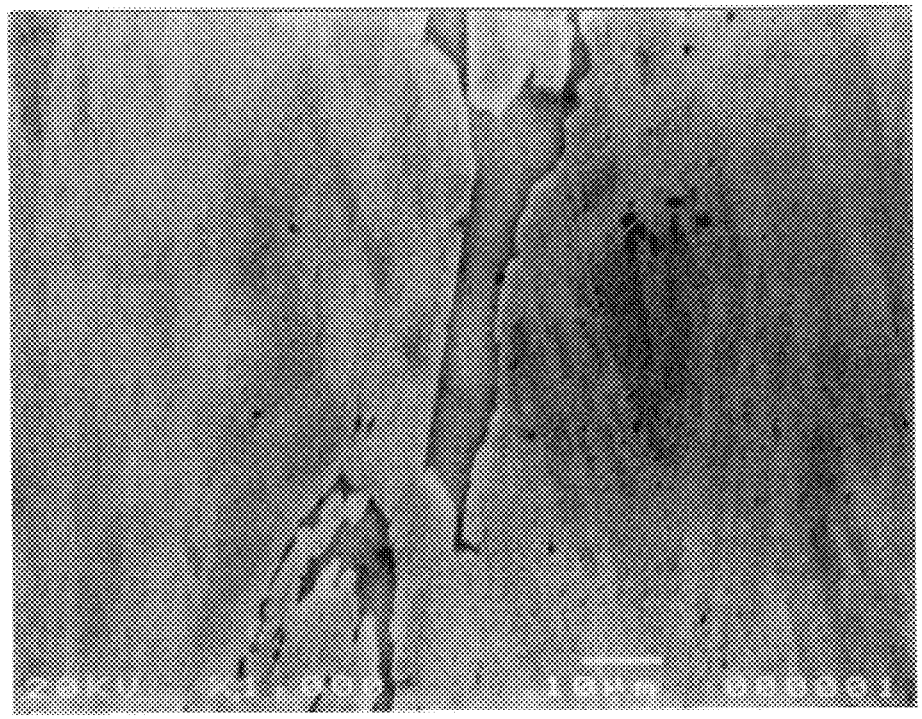
FIG. 10 is a photograph showing the ceramic micro-structure in which the filled state of the cracks with the metallic silicon is enlarged.

FIG. 9 is a photograph of a ceramic microstructure when the thus obtained gas-tight article was cut and viewed in a crossing direction, and FIG. 10 is an enlarged view of the photograph of the ceramic microstructure in FIG. 9 including a portion of the crack into which silicon is filled. In the photograph of FIG. 9, a space, the silicon carbide film and the sintered body appear.

Figure 6C:
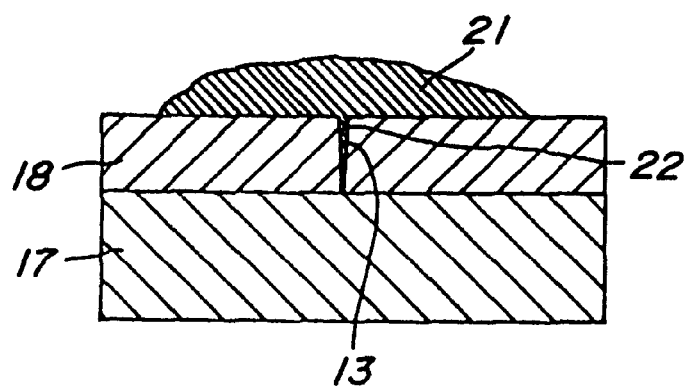
FIG. 6(c) is a sectional view for schematically illustrating a state in which the metallic silicon is melted on the film of silicon carbide.
Figure 11:
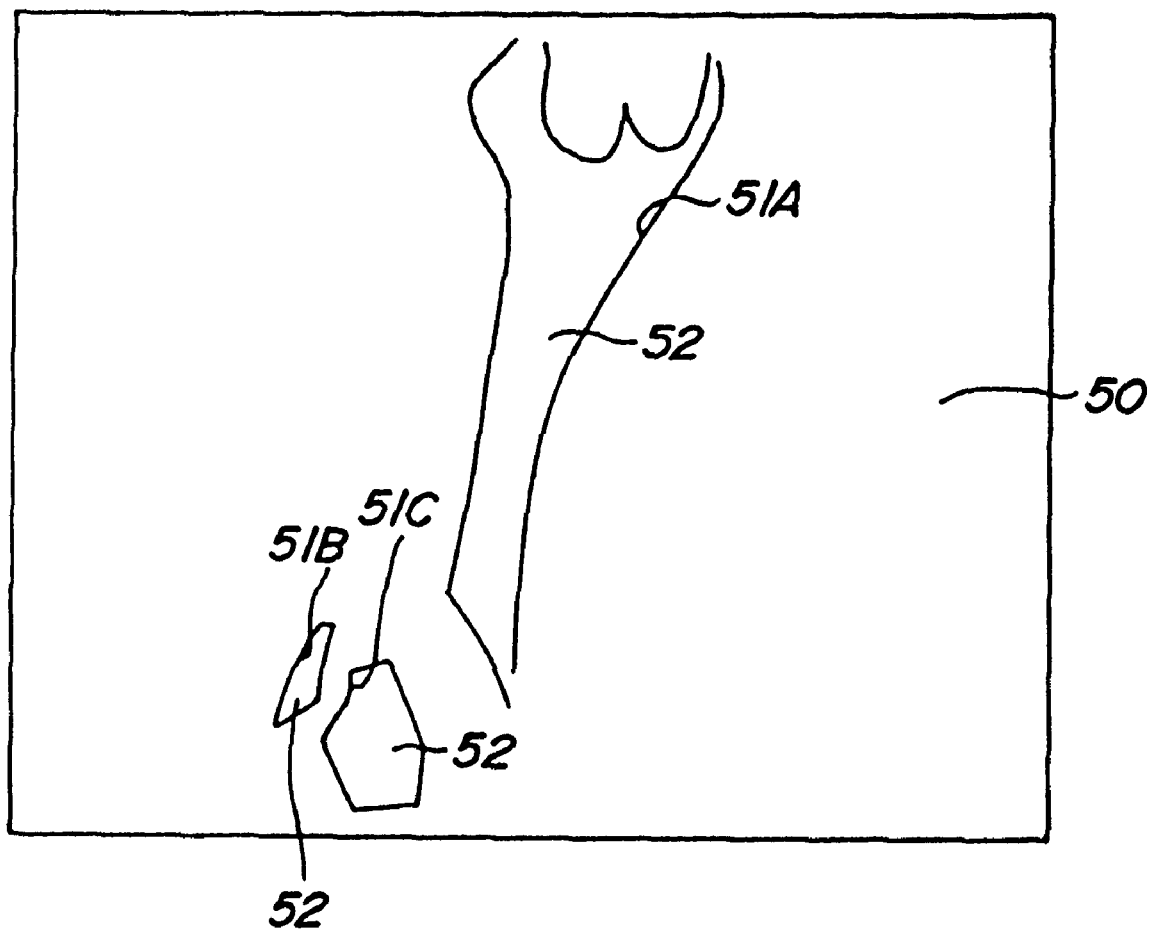
FIG. 11 is a figure for illustrating the photograph in FIG. 10.
Figure 12:
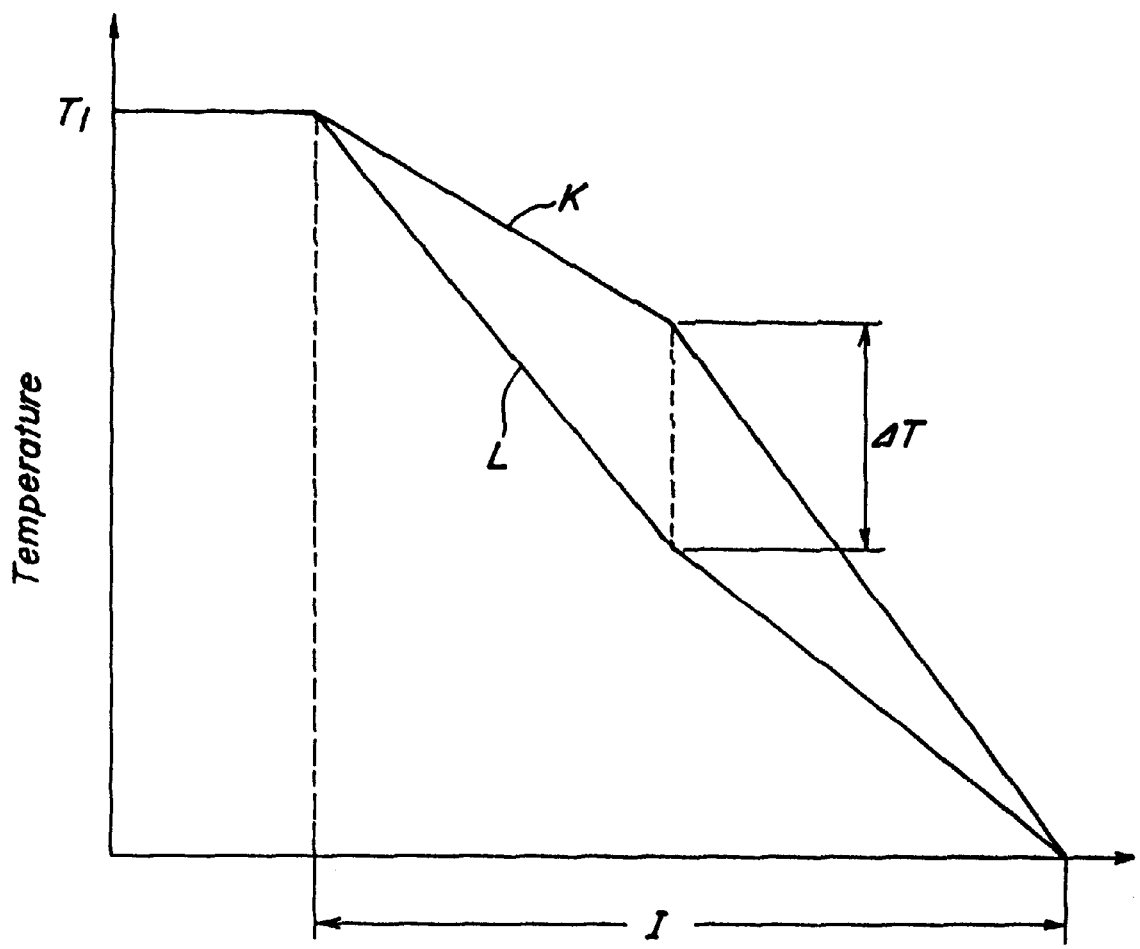
FIG. 12 is a graph showing a temperature schedule to be adopted as a preferred embodiment of the present invention.

As is clearly shown, particularly, in FIGS. 9 and 10, the crack is completely filled with the metallic silicon after cooling. In FIG. 9, the crack 13 extends from the surface of the silicon carbide film 18 to an interface between the film 18 and the sintered body 17, and the metallic silicon 22 is filled into the entire crack 13 as illustrated in FIG. 6(c). A reference numeral 21 denotes the metallic silicon. Careful observation of the crack in FIG. 9 reveals that a part of the crack extends up to closed pores in the sintered body beyond the interface between the sintered body and the silicon carbide film. The metallic silicon is filled into the crack having a width of 5 to 30 μm such that the metallic silicon is also filled into the cracks inside the sintered body and the closed pores continuing to these cracks. The enlarged photograph in FIG. 10 shows that as schematically shown in the illustrative view of FIG. 11, the crack 51A is formed in the microstructure 50 of silicon carbide, and the crack 51A has a complicated shape, and continues to cracks 51B and 51C, for example. The metallic silicon 52 is filled into not only the crack 51A but also the cracks 51B and 51C.

Figure 6D:
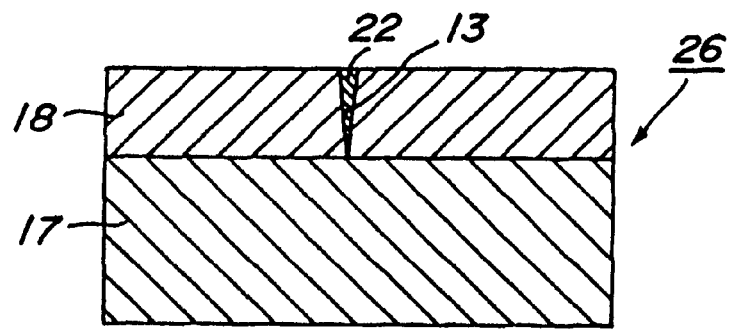
FIG. 6(d) is a sectional view for illustrating a state in which excess metallic silicon is removed.

Then, excess metallic silicon 21 on the surface of the silicon carbide film is removed by sand blasting, thereby obtaining a gas-tight article 26 as shown in FIG. 6(d).

In the actual silicon carbide film, some cracks were confined inside the film or stopped at the interface between the silicon carbide film and the sintered body, and the other advanced in the sintered body. However, it was confirmed that all of the cracks were filled with the metallic silicon. It is considered that the melted metallic silicon is sucked and spread into the cracks as water is sucked into a capillary tube.

After the cracks were filled with metallic silicon, the surface of the silicon carbide film was polished with use of a #400 grinding stone. Measurement of a helium leaking rate of the resulting gas-tight article as in Comparative Examples exhibited no leak with $10^{-9}$ Torr·liter/sec.

Further, the gas-tight article was subjected to 250 heat impacts in the same way as in Comparative Examples, and formation of new crack was not found after the heat impact test. Then, the surface of the silicon carbide film was polished with use of a #400 grinding stone. Measurement of a helium leaking rate of the resulting gas-tight article as in Comparative Examples exhibited no leak with $10^{-9}$ Torr·liter/sec.

Invention Example 2

Gas-tight articles were produced as in Invention Example 1 except that the diameter of each sintered body was increased to 400 mm, and the resulting gas-tight articles were subjected to the same tests as in Invention Example 1. Consequently, the same results as in Invention Example 1 were obtained.

Gas-tight articles obtained according to Invention Examples 1 and 2 were subjected to 250° C. heat impact tests. More specifically, the gas-tight article was placed and heated to 250° C. in an electric furnace, and then the article was immersed in water at room temperature. The test revealed that cracks were sometimes formed in the silicon carbide film when the 250° C. heat impacts were repeatedly applied at 20 times or more.

Invention Example 3

A film of silicon carbide was formed on a sintered body, and then subjected to a 180° C. heat impact test in the same way as in Comparative Examples, thereby forming cracks in the silicon carbide film. Then, the metallic silicon was filled into the cracks in the same way as in Invention Example 1.

This gas-tight article was subjected to a 250° C. heat impact test. More specifically, the gas-tight article was placed and heated to 250° C. in an electric furnace, and then the article was immersed in water at room temperature. Formation of new cracks was not found in the silicon carbide film after the 250° C. heat impact test. Measurement of a helium leaking rate of the resulting gas-tight article as in Comparative Examples exhibited no leak with $10^{-9}$ Torr·liter/sec retained.

Invention Example 4

A film of silicon carbide was formed on a sintered body in the same way as in Comparative Examples. In a cooling step I after the formation of the silicon carbide film by chemical vapor deposition, the temperature of a heater at a side where the silicon carbide film was to be vapor deposited was set lower as indicated by a line L, whereas that of a heating heater at a side where no silicon carbide film was to be formed was set higher as indicated by a line K. $\Delta T$ is a difference in temperature between these heaters. In this example, the maximum temperature difference $\Delta T$ was adjusted to 150° C.

As a result, as compared with Comparative Examples and Invention Example 1, a greater number of cracks were formed in the silicon carbide film, although the sintered body was not broken. A gas-tight article was obtained by filling cracks with metallic silicon in the same way as in Invention Examples.

Although this gas-tight article was subjected to 250 times heat impacts at 250° C., formation of new cracks was not found even after the heat impact test. Further, a helium leaking rate of the resulting gas-tight article was retained to $10^{-9}$ Torr·liter/sec.

Invention Example 5

A film of silicon carbide was formed on a sintered body in the same way as in Comparative Examples. In this Invention Example, as shown in FIG. 13, a flow rate of a carrier gas in a cooling step I after the formation of the silicon carbide by chemical vapor deposition was set greater than in a film-forming step H. A carrier gas was flown on a side of the silicon carbide film at a flow rate being 3 to 5 times as much as in Comparative Examples 3–5. In FIG. 13, D is the amount of the reaction gas, and E the amount of the carrier gas. In the cooling step I, D=0, and E is 3 to 5 times as much as that in the step H. C is the temperature.

As a result, a greater number of cracks were formed in the resulting silicon carbide film as compared with Comparative Examples and Invention Example 1. However, the sintered body was not broken. A gas-tight article was obtained by filling cracks with metallic silicon in the same way as in Invention Examples.

Although this gas-tight article was subjected to 250 times heat impacts at 250° C., formation of new cracks was not found even after the heat impact test. Further, a helium leaking rate of the resulting gas-tight article was retained to $10^{-9}$ Torr·liter/sec.

In each of Invention Examples 1 to 5, although the locations where cracks were formed in the silicon carbide film are limited to an outer peripheral portion thereof, and the lengths and the specific locations of the cracks vary. Thus, the identical gas-tight articles cannot be obtained in the production. Further, if a crack extends from the outer peripheral side toward the inner portion of the gas-tight article 2 and continues to an area of the inner portion, the metallic silicon charged into the crack is likely to be exposed to plasma gas, since the area of the inner portion of the gas-tight article is exposed to plasma gas. Thus, the metallic silicon is preferentially corroded with the plasma gas. Further, in Invention Example 1, new cracks were sometimes formed in an area of the silicon carbide film where no crack had been formed, when the gas-tight article was subjected to a 250° C. heat impact test with a more severe heat impact condition.

Under the circumstances, as shown in FIGS. 14(a) and 14(b), radially extending grooves 33 were formed at an outer peripheral portion of a sintered body 30. The locations and the numbers of the grooves are appropriately selected. Each groove 33 extends from the outer peripheral face 30a toward the inner peripheral portion of the sintered body 30.

Then, a film of silicon carbide was formed in the same way as in Invention Example 1, and each of cracks was filled with metallic silicon in the same way as in Invention Example 1, thereby obtaining a gas-tight article 34 as shown in FIGS. 15(a) and 15(b). In the gas-tight article 34, the silicon carbide film 35 is formed on a surface of the sintered body 30. Since tensile stress is applied to particularly around corners 36 of the grooves 33 in the silicon carbide film 35, cracks 31 are formed substantially along the grooves 33. The cracks 31 are filled with the metallic silicon.

Although this gas-tight article was subjected to 250 times heat impacts at 250° C., the formation of new cracks was not found even after the heat impact test. Further, a helium leaking rate of the resulting gas-tight article was retained to $10^{-9}$ Torr·liter/sec.

Invention Example 7

Figure 16A:
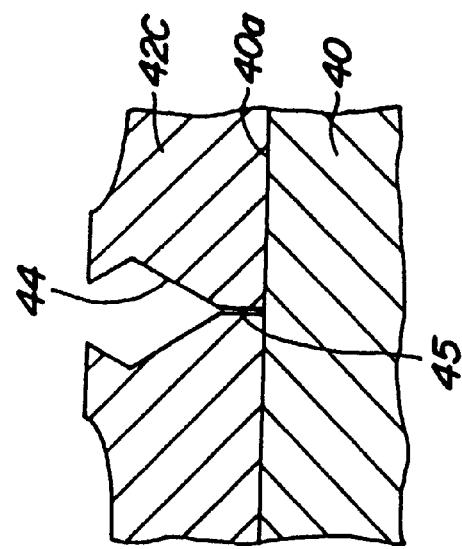
FIGS. 16(a), 16(b) and 16(c) are sectional views for illustrating a process to form an opening 44 and a crack in a film of silicon carbide.

As shown in FIG. 16(a), for example, a shaping member 41 made of such as carbon was opposed to and fixed above a surface of an outer peripheral portion 40a of a sintered body 40. A tip portion 41a of the shaping member 41 had a blade-shaped form. The shaping member 41 was fixed at a location for the formation of a crack in a film of silicon carbide. Sore specifically, the location of setting the planar shaping member was aligned with the location of a groove 33 to be formed.

Figure 16B:
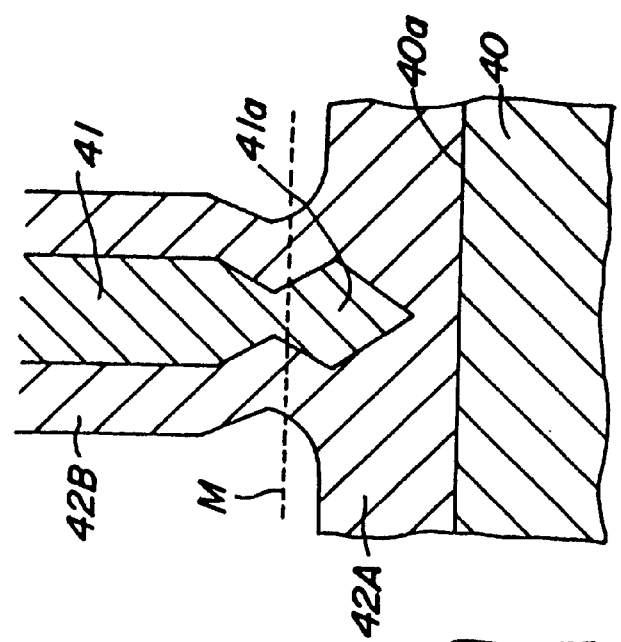
Figure 16C:
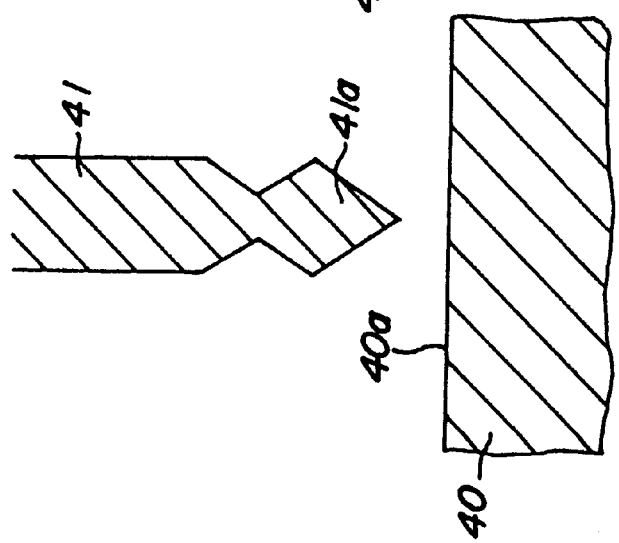

Next, a film of silicon carbide was formed in the same manner as in Invention Example 1. In this case, as shown in FIG. 16(b), not only a film 42A of silicon carbide was formed on the surface 40a, but also a film 42B of silicon carbide was formed to cover the shaping member 41. Thereafter, the shaping member 41 made of carbon was removed along a line M by the sand blasting method, thereby obtaining a film 42C of silicon carbide having a shape as shown in FIG. 16(c). The shaping member 41 made of graphite was removed by sand blasting.

In the film 42C, an opening 44 having almost the same shape as that of the blade-like tip portion 41a of the shaping member was formed, a crack 45 was formed between the tip of the opening 44 and the surface 40*a* of the sintered body 40. The crack 45 was formed only at a portion of the film where the planar member 41 made of carbon was arranged. The crack did not extend into the central portion of the gas-tight article.

Then, metallic silicon was melted in the same way as in Invention Example 1. As a result, as shown in FIG. 17(*a*), the opening 44 and the crack 45 were filled with the metallic silicon, and a film 46 of the metallic silicon was formed to cover the silicon carbide film 42C. Thereafter, the metallic silicon film was removed by polishing with sand blasting or diamond grinding stone, thereby obtaining a gas-tight article as shown in FIG. 17(*b*).

In this gas-tight article, an opening 48 and a crack 45 extending under the opening 48 are formed in the silicon carbide film 47, and the opening 48 and the crack 45 are filled with metallic silicon 49.

Although this gas-tight article was subjected to 250 times heat impacts at 250° C., formation of new cracks was not found even after the heat impact test. Further, a helium leaking rate of the resulting gas-tight article was retained to $10^{-9}$ Torr·liter/sec.

According to the present invention, there is provided the gas-tight article which comprises the sintered body composed mainly of silicon carbide and a film of silicon carbide formed on a surface of the sintered body by the chemical vapor deposition and covering that surface and which has high gas tightness and corrosion resistance and maintain gas tightness even under application of heat impact and heat cycles.

What is claimed is:

1. A gas-tight article comprising:

a sintered body comprising silicon carbide, and a film of silicon carbide formed on a surface of said sintered body by chemical vapor deposition;

wherein said film comprises regions of metallic silicon which fill cracks generated in said film.

2. The gas-tight article set forth in claim 1, wherein purity of the silicon carbide in the film is not less than 99.999 wt %, and purity of the metallic silicon is not less than 99.999 wt %.

3. The gas-tight article set forth in claim 1, wherein the sintered body is a sintered body in which a compounding percentage of silicon carbide is not less than 90% or a sintered body of a mixture comprising silicon carbide and metallic silicon.

4. The gas-tight article set forth in claim 1, wherein the sintered body has a flat planar shape of which a width is not less than 300 mm, and not less than 80% of a main plane surface which is perpendicular to a thickness direction of the sintered body is covered with the film of silicon carbide.

5. The gas-tight article set forth in claim 1, wherein a thickness of the film of the silicon carbide is not less than 0.5 mm.

* * * * *